United States Patent [19]
Fleurial et al.

[11] Patent Number: 5,610,366
[45] Date of Patent: Mar. 11, 1997

[54] HIGH PERFORMANCE THERMOELECTRIC MATERIALS AND METHODS OF PREPARATION

[75] Inventors: Jean-Pierre Fleurial; Thierry F. Caillat, both of Pasadena; Alexander Borshchevsky, Santa Monica, all of Calif.

[73] Assignee: California Institute of Technology, Pasedena, Calif.

[21] Appl. No.: 189,087

[22] Filed: Jan. 28, 1994

Related U.S. Application Data

[63] Continuation-in-part of Ser. No. 101,901, Aug. 3, 1993.

[51] Int. Cl.[6] .................................................. H01L 35/18
[52] U.S. Cl. ........................ 136/202; 204/200; 204/223; 252/62.3 T; 136/236.1; 136/240; 136/238; 136/205
[58] Field of Search ..................... 257/62.3 T; 117/200, 117/223; 136/203, 205, 224, 236.1, 240, 202, 238

[56] References Cited

U.S. PATENT DOCUMENTS

| | | | |
|---|---|---|---|
| 2,588,254 | 3/1952 | Lark-Horovitz et al. | 136/89 |
| 2,798,989 | 7/1957 | Welker | 317/237 |
| 3,124,936 | 3/1964 | Melehy | 62/3 |
| 3,259,759 | 7/1966 | Giaever | 307/88.5 |
| 3,296,033 | 1/1967 | Scuro et al. | 136/205 |
| 3,338,753 | 8/1967 | Horsting | 136/237 |
| 3,342,567 | 9/1967 | Dingwall | 29/195 |
| 3,356,464 | 12/1967 | Hulliger | 23/315 |
| 3,626,583 | 12/1971 | Abbott et al. | 29/573 |
| 3,674,568 | 7/1972 | Caprarola | 136/205 |

(List continued on next page.)

FOREIGN PATENT DOCUMENTS 1216001  1/1968  United Kingdom.

OTHER PUBLICATIONS

Vining, C. B. & J.-P. Fleurial, "Silicon–Germanium: an Overview of Recent Developments," Proceedings of the Xth Intl. Conference on thermoelectrics, Univ. of Wales, Cardiff, UK, pp. 1–14, Sep. 10–12, 1991.

Caillat, T., et al., "Search for New High Temperature Thermoelectric Materials," Proceedings of the 27th Intersociety Energy Conversion Engineering Conference, pp. 3499–3503, Aug. 3–7, 1992.

Caillat, T., et al., "Thermoelectric Properties of a New Semiconductor IrSb$_3$," Proceedings of the XIth Intl. Conference on Thermoelectrics, Univ. of Texas, Arlington, TX pp. 98–101, Oct. 7–9, 1992.

(List continued on next page.)

*Primary Examiner*—William D. Larkins
*Attorney, Agent, or Firm*—Baker & Botts, L.L.P.

[57] ABSTRACT

Transition metals (T) of Group VIII (Co, Rh and Ir) have been prepared as semiconductor alloys with Sb having the general formula TSb$_3$. The skutterudite-type crystal lattice structure of these semiconductor alloys and their enhanced thermoelectric properties results in semiconductor materials which may be used in the fabrication of thermoelectric elements to substantially improve the efficiency of the resulting thermoelectric device. Semiconductor alloys having the desired skutterudite-type crystal lattice structure may be prepared in accordance with the present invention by using vertical gradient freeze techniques, liquid-solid phase sintering techniques, low temperature powder sintering and/or hot-pressing. Measurements of electrical and thermal transport properties of selected semiconductor materials prepared in accordance with the present invention, demonstrated high Hall mobilities (up to 8000 cm$^2$.V$^{-1}$.s$^{-1}$), good Seebeck coefficients (up to 400 μVK$^{-1}$ between 300° C. and 700° C.), and low thermal conductivities (as low as 15 mW/cmK). Optimizing the transport properties of semiconductor materials prepared from elemental mixtures Co, Rh, Ir and Sb resulted in a two fold increase in the thermoelectric figure of merit (ZT) at temperatures as high as 400° C. for thermoelectric elements fabricated from such semiconductor materials.

42 Claims, 6 Drawing Sheets

U.S. PATENT DOCUMENTS

| | | | |
|---|---|---|---|
| 3,721,583 | 3/1973 | Blakeslee | 117/215 |
| 3,873,370 | 3/1975 | Hampl, Jr. et al. | 136/205 |
| 4,029,520 | 6/1977 | Hampl, Jr. | 136/205 |
| 4,088,515 | 5/1978 | Blakeslee et al. | 148/175 |
| 4,261,771 | 4/1981 | Dingle et al. | 148/175 |
| 4,368,416 | 1/1983 | James | 322/2 R |
| 4,457,897 | 7/1984 | Stanley et al. | 423/141 |
| 4,469,977 | 9/1984 | Quinn et al. | 310/334 |
| 4,620,897 | 11/1986 | Nakajima | 156/602 |
| 4,644,753 | 2/1987 | Burke | 62/3 |
| 4,664,960 | 5/1987 | Ovshinsky | 428/98 |
| 4,786,335 | 11/1988 | Knowles et al. | 136/214 |
| 4,847,666 | 7/1989 | Heremans et al. | 357/16 |
| 4,855,810 | 8/1989 | Gelb et al. | 357/87 |
| 4,869,971 | 9/1989 | Nee et al. | 428/635 |
| 4,999,082 | 3/1991 | Kremer et al. | 156/605 |
| 5,006,178 | 4/1991 | Bijvoets | 136/211 |
| 5,021,224 | 6/1991 | Nakajima | 422/248 |
| 5,051,786 | 9/1991 | Nicollian et al. | 357/4 |
| 5,064,476 | 11/1991 | Recine, Sr. | 136/201 |
| 5,156,004 | 10/1992 | Wu et al. | 62/3 |
| 5,181,086 | 1/1993 | Yoshida | 257/18 |
| 5,210,428 | 5/1993 | Goossen | 257/17 |
| 5,288,336 | 2/1994 | Strachan et al. | 136/200 |
| 5,415,699 | 5/1995 | Harman | 136/238 |
| 5,436,467 | 7/1995 | Elsner et al. | 257/25 |
| 5,439,528 | 8/1995 | Miller | 136/200 |
| 5,448,109 | 9/1995 | Cauchy | 257/719 |

OTHER PUBLICATIONS

Caillat, T., et al., "Phase Diagram of the Ir–Sb System on the Antimony–Rich Part," Journal of Alloys and Compounds, 1993.

Kjekshus, A., "Thigh Temperature X–Ray Study of the Thermal Expansion of IrAst+sc 3 and IrSbt+sc 3 , " Acta Chemica Scandinava, pp. 678–681, 1961.

Fleurial, J.–P., "Thermal and Electrical Transport Properties Modeling of $Bi_2Te_3$–Based Alloys," Proceedings of the XIth Intl. Conf. on Thermoelectrics, Univ. of Texas, Arlington, TX pp. 276–281, Oct. 7–Sep. 1992.

Bass, J. C. and N. Elsner, "Current Thermoelectric Programs at Hi–Z Technology, Inc.," Proceedings of the XIth Intl. Conference on Thermoelectrics, Univ. of Texas, Arlington, TX, pp. 1–3, Oct. 7–9, 1992.

Borshchevsky, A., et al., "Two–Zone Bridgman Furnace with Sharp Thermal Gradient," NASA Tech Brief, 18 (3) Item #74, Mar. 1994.

Dudkin, L. D., et al., "On the Doping of the Semiconductor Compound $CoSb_3$, " Zuhr. Neorg. Khim., 1958.

Feschotte P., and D. Lorin, "Les Systemes Binaires Fe–Sb, Co–Sb et Ni–Sb," J. Less Common Metals, pp. 155, 255–269, 1989.

Kajikawa, T., et al., "Advancement of Thermoelectric Energy Conversion Systems in Japan," Proceedings of the XIth Intl. Conference on Thermoelectrics, Univ. of Texas, Arlington, TX, pp. 175–180, Oct. 7–9, 1992.

Kliche, G. W. Bauhofer, "Infrared Reflection Spectra and Electrical Properties of the Skutterudite RhSb3," Mat. Res. Bull., (22), pp. 551–555, 1987.

Korenstein, R. et al., "Preparation and Characterization of the Skutterudite–Related Phases CoGe1.5 and CoGe1.5Se1.5," Inorg. Chemist., 16(9), pp. 2344–2346, 1977.

Lutz,, H. D., et al. "Far–Infrared Spectra, Optical and Dielectric Constants, Effective Charges and Lattice Dynamics of the Skutterudites CoP3CoAs3 and CoSb3," Phys. Stat. Sol. (b), pp. 112, 549–557, 1982.

Lyons, A., et al., "The Preparation and Characterization of Some Skutterudite Related Compounds," Mat. Res. Bull., (13), pp. 125–128, 1978.

Nikolaev, Yu V., et al., "A Terrestrial Solar Power Plant with Direct Energy Conversion," Proceedings of the 27th Intersociety Energy Conversion Conference, pp. 3433–3436, Aug. 3–7, 1992.

Vining, C. B., "The Thermoelectric Limit ZT=1: Fact or Artifact . . . ," Proceedings of the XIth Intl. Conference on Thermoelectrics, Univ. of Texas, Arlington, TX, pp. 223–231, Oct. 7–9, 1992.

Zhuravlev, N. N., Vestn. Mosk. Univ., Ser. Mat., Mekh., Astron., Fiz. I Khim., 13 (5) pp. 79–82, 1958.

HIGH PERFORMANCE THERMOELECTRIC MATERIALS AND METHODS OF PREPARATION

NOTICE

The invention described herein was made in the performance of work under a NASA contract, and is subject to the provisions of Public Law 96-517 (35 U.S.C. 202) in which the Contractor has elected to retain title.

RELATED PATENT APPLICATION

This patent application is a continuation-in-part of patent application U.S. Ser. No. 08/101,901 filed Aug. 3, 1993 (Attorney's Docket 17083-0118).

TECHNICAL FIELD OF THE INVENTION

This invention relates to semiconductor materials having enhanced thermoelectric properties and preparation of such materials.

BACKGROUND OF THE INVENTION

The basic theory and operation of thermoelectric devices has been developed for many years. Such devices may be used for heating, cooling, temperature stabilization, power generation and temperature sensing. Modern thermoelectric coolers typically include an array of thermocouples which operate by using the Peltier effect.

Thermoelectric devices are essentially heat pumps and power generators which follow the laws of thermodynamics in the same manner as mechanical heat pumps, refrigerators, or any other apparatus used to transfer heat energy. The principal difference is that thermoelectric devices function with solid state electrical components (thermocouples) as compared to more traditional mechanical/fluid heating and cooling components. The efficiency of a thermoelectric device is generally limited to its associated Carnot cycle efficiency reduced by a factor which is dependent upon the thermoelectric figure of merit (ZT) of the materials used in fabrication of the thermoelectric device.

The dimensionless figure of merit ZT represents the coupling between electrical and thermal effects in a material and is defined as:

$$ZT = S^2 \sigma T / \kappa \qquad (1)$$

where S, σ, κ, and T are the Seebeck coefficient, electrical conductivity, thermal conductivity and absolute temperature, respectively. The basic thermoelectric effects are the Seebeck and Peltier effects. The Seebeck effect is the phenomenon underlying the conversion of heat energy into electrical power and is used in thermoelectric power generation. The complementary effect, the Peltier effect, is the phenomenon used in thermoelectric refrigeration and is related to heat absorption accompanying the passage of current through the junction of two dissimilar materials.

The ZT may also be stated by the equation:

$$ZT = \frac{S^2 T}{\rho \kappa} \qquad (2)$$

ρ = electrical resistivity
σ = electrical conductivity $$\text{electrical conductivity} = \frac{1}{\text{electrical resistivity}}$$

or $$\sigma = \frac{1}{\rho}$$

Thermoelectric materials such as alloys of $Bi_2Te_3$, PbTe and BiSb were developed thirty to forty years ago. Semiconductor alloys such as SiGe have also been used in fabrication of thermoelectric devices. Commercially available thermoelectric materials are generally limited to use in a temperature range between 200° K. and 1300° K. with a maximum ZT value of approximately one. The efficiency of such thermoelectric devices remains relatively low at approximately five to eight percent (5–8%) energy conversion efficiency. For the temperature range of −100° C. to +1000° C., maximum ZT of current state of the art thermoelectric materials remains limited to values of approximately 1, except for Te-Ag-Ge-Sb alloys (TAGS) which may achieve a ZT of 1.2 in a very narrow temperature range. Thermoelectric materials such as $Si_{80}Ge_{20}$ alloys used in thermoelectric generators to power spacecrafts for deep space missions have a ZT approximately equal to 0.7 from 300° C. to 1,000° C.

SUMMARY OF THE INVENTION

In accordance with the present invention disadvantages and problems associated with the previous design and preparation of materials used in the manufacture of thermoelectric devices have been substantially reduced or eliminated. The present invention provides the ability to obtain increased efficiency from a thermoelectric device by using materials with a skutterudite-type crystal lattice structure and desired thermoelectric properties in fabrication of the thermoelectric device. Examples of semiconductor materials and alloys which are satisfactory for use with the present invention include, but are not limited to, $IrSb_3$, $RhSb_3$, $CoSb_3$, $Co_{1-x-y}Rh_xIr_ySb_3$ wherein $0 \leq x \leq 1$ and $0 \leq y \leq 1$ and related alloys.

In accordance with one aspect of the present invention, P-type semiconductor materials are formed from alloys of $CoSb_3$, $RhSb_3$, $IrSb_3$ or $Co_{1-x-y}Rh_xIr_ySb_3$ for use in manufacturing thermoelectric devices with substantially enhanced operating characteristics and improved efficiency as compared to previous thermoelectric devices.

In accordance with another aspect of the present invention, N-type semiconductor materials are formed from alloys of $CoSb_3$, $RhSb_3$, $IrSb_3$ or $Co_{1-x-y}Rh_xIr_ySb_3$ for use in manufacturing thermoelectric devices with substantially enhanced operating characteristics and improved efficiency as compared to previous thermoelectric devices.

An important technical advantage of the present invention includes the use of gradient freeze techniques in the preparation of semiconductor materials such as $IrSb_3$, $RhSb_3$ and $CoSb_3$. The use of gradient freeze techniques in accordance with the present invention produces a large, single crystal of semiconductor alloys having a skutterudite lattice structure. A Bridgman Two-Zone furnace and a sealed container have been modified for use in preparation of semiconductor materials in accordance with the present invention.

Another important technical advantage of the present invention includes the use of liquid-solid phase sintering techniques in the preparation of semiconductor materials such as $IrSb_3$, $RhSb_3$, $CoSb_3$ and $Co_{1-x-y}Rh_xIr_ySb_3$. The use of liquid-solid phase sintering techniques in accordance with the present invention produces large, polycrystalline ingots of semiconductor alloys having a skutterudite lattice structure. An isothermal furnace and a sealed container have been modified for use in preparation of semiconductor alloys in accordance with the present invention.

A further important technical advantage of the present invention includes the use of low temperature powder sintering and/or hot pressing in the preparation of semiconductor alloys such as $IrSb_3$, and $Co_{1-x-y}Rh_xIr_ySb_3$. The use of powder sintering and/or hot pressing in accordance with the present invention produces large polycrystalline pellets of semiconductor alloys having a skutterudite lattice structure.

Another aspect of the present invention includes manufacturing a thermoelectric device with P-type thermoelectric elements formed from materials such as $CoSb_3$, $RhSb_3$, $IrSb_3$ or $Co_{1-x-y}Rh_xIr_ySb_3$ and N-type thermoelectric elements formed from Bi-Sb alloys, $Bi_2Te_3$ based alloys, PbTe based alloys, $\beta$-$FeSi_2$ based alloys, $Ga_{1-x}In_xSb$ based alloys, or SiGe alloys.

The present invention allows the manufacture of thermoelectric energy conversion devices such as electrical power generators, heaters, coolers, thermocouples and temperature sensors with high ZT and associated increased efficiency. By using semiconductor alloys such as $IrSb_3$, $RhSb_3$, $CoSb_3$, $Co_{1-x-y}Rh_xIr_ySb_3$ and related alloys which have been prepared in accordance with the present invention, the overall efficiency of a thermoelectric device may be substantially enhanced. Thermoelectric elements fabricated from semiconductor materials such as $IrSb_3$, $RhSb_3$, $CoSb_3$, and $Co_{1-x-y}Rh_xIr_ySb_3$ with skutterudite-type crystal lattice structures have demonstrated a ZT of 2.

A further important technical advantage includes the use of semiconductor materials prepared in accordance with the present invention in the manufacture of a radioisotope thermoelectric generator (RTG) to double the associated system efficiency of the resulting RTG. Other thermoelectric devices manufactured from semiconductor materials fabricated in accordance with the present invention may be used in waste heat recovery systems, automobiles, remote power generators, temperature sensors and coolers for advanced electronic components such as field effect transistors.

BRIEF DESCRIPTION OF THE DRAWINGS

For a more complete understanding of the present invention and its advantages, reference is now made to the following description taken in conjunction with the accompanying drawings in which.

DETAILED DESCRIPTION OF THE INVENTION

The preferred embodiments of the present invention and its advantages are best understood by reference to FIGS. 1 through 14 of the drawings, like numerals being used for like and corresponding parts of the various drawings.

Figure 1:
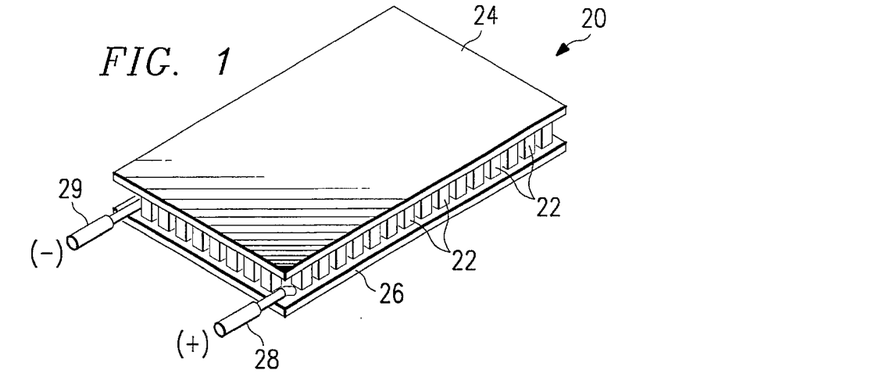
FIG. 1 is an isometric drawing of a thermoelectric device which may be manufactured from materials incorporating the present invention.
Figures 2, 2A:
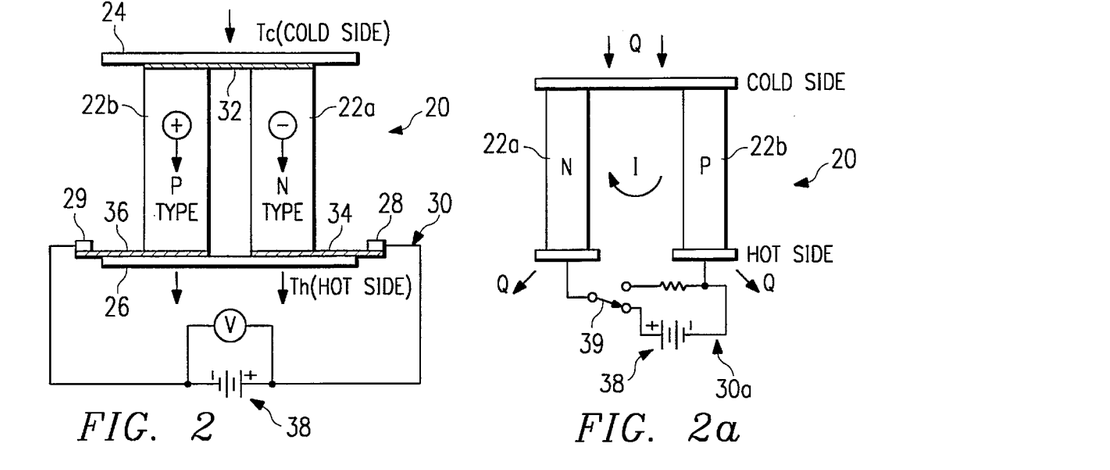
FIG. 2 is a schematic drawing of the electrical circuit associated with the thermoelectric device of FIG. 1.
FIG. 2a is a schematic drawing of an electrical circuit associated with the thermoelectric device of FIG. 1 functioning as a cooler.

Thermoelectric device 20, as shown in FIGS. 1 and 2, may be manufactured from semiconductor materials and alloys which have been prepared in accordance with the present invention. The use of such semiconductor materials will substantially increase the energy conversion efficiency of thermoelectric device 20. Thermoelectric device 20 may be used as a heater and/or a cooler.

Thermoelectric device 20 is preferably manufactured with a plurality of thermoelectric elements (sometimes referred to as "thermocouples") 22 disposed between cold plate 24 and hot plate 26. Ceramic materials are frequently used in the manufacture of plates 24 and 26 which define in part the cold side and hot side, respectively, of thermoelectric device 20.

Electrical power connections 28 and 29 are provided to allow attaching thermoelectric device 20 to an appropriate source of DC electrical power. If thermoelectric device 20 was redesigned to function as an electrical power generator, electrical connections 28 and 29 would represent the output terminals from such a power generator operating between hot and cold temperature sources (not shown). Such electrical power generators may be used for various applications such as waste heat recovery systems (not shown), space power system 200 and radioisotope thermoelectric power generator 300.

FIG. 2 is a schematic representation of electrical circuit 30 associated with thermoelectric device 20. Electrical circuit 30 is typical of electrical circuits associated with using thermoelectric elements or thermocouples 22 for heating and/or cooling. Electrical circuit 30, which is typical for a single stage thermoelectric device such as thermoelectric device 20, generally includes two dissimilar materials such as N-type thermoelectric elements 22a and P-type thermoelectric elements 22b. Thermoelectric elements 22 are typically arranged in an alternating N-type element to P-type element configuration. In many thermoelectric devices, semiconductor materials with dissimilar characteristics are connected electrically in series and thermally in parallel.

A common property of semiconductor materials is that electricity can be conducted by two type of carriers: electrons in N-type materials and holes in P-type materials. In a crystal, when one atom is replaced by another atom with more valence electrons, the extra electrons are not needed for bonding and are free to move throughout the crystal. This type of electrical conduction is called n-type. However, when an atom is replaced by another atom with fewer electrons, a bond is left vacant and this shortage is referred to as a hole. This type of electrical conduction is called P-type. The extra electrons in the N-type semiconductor materials and the extra holes in the P-type semiconductor materials are frequently referred to as "charge carriers." Heat may be conducted between cold side (or cold plate 24) and hot side (or hot plate 26) of thermoelectric elements 22 by charge carriers (electron or holes) and vibrations of the crystal lattice structure. Such lattice vibrations are referred to as "phonons".

In thermoelectric device 20, alternating thermoelectric elements 22 of N-type and P-type semiconductor materials have their ends connected in a serpentine fashion by electrical conductors such as 32, 34 and 36. Conductors 32, 34 and 36 are typically metallizations formed on the interior surfaces of plates 24 and 26. Commercially available thermoelectric coolers frequently include two metallized ceramic plates with P-type and N-type elements of bismuth telluride alloys soldered between the ceramic plates.

When DC electrical power from power supply 38 is applied to thermoelectric device 20 having an array of thermoelectric elements 22, heat energy is absorbed on cold side 24 of thermoelectric elements 22. The heat energy passes through thermoelectric elements 22 and is dissipated on hot side 26. A heat sink (sometimes referred to as the "hot sink", not shown) may be attached to hot plate 26 of thermoelectric device 20 to aid in dissipating heat from thermoelectric elements 22 to the adjacent environment. In a similar manner a heat sink (sometimes referred to as a "cold sink", not shown) may be attached to cold side 24 of thermoelectric device 20 to aid in removing heat from the adjacent environment.

Figure 2B:
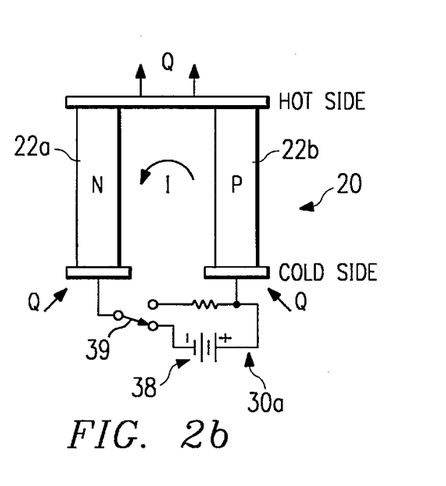
FIG. 2b is a schematic drawing of an electrical circuit associated with the thermoelectric device of FIG. 1 functioning as a heat pump.
Figure 2C:
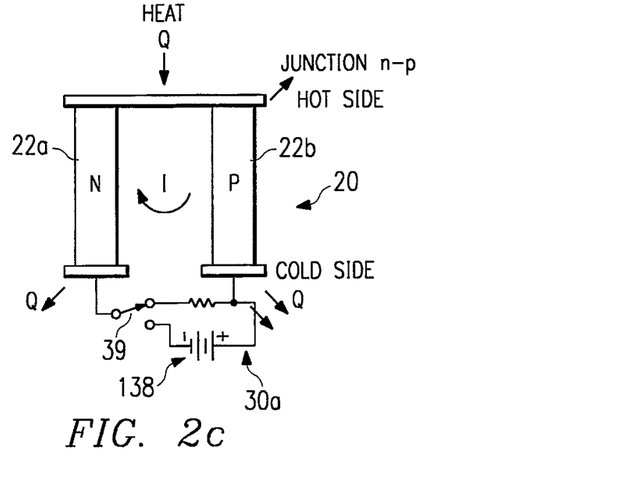
FIG. 2c is a schematic drawing of an electrical circuit associated with the thermoelectric device of FIG. 1 functioning as a power generator.

Thermoelectric device 20 may sometimes be referred to as a thermoelectric cooler. However, since thermoelectric devices are a type of heat pump, thermoelectric device 20 may be designed to function as either a cooler, heater, or power generator. FIGS. 2a 2b and 2c are schematic representations showing these alternative uses for thermoelectric device 20. In FIG. 2a thermoelectric elements 22 and the electrical circuit 30a have been configured to allow thermoelectric device 20 to function as a cooler similar to circuit 30 shown in FIG. 2. FIG. 2b demonstrates that changing the position of switch 39 allows essentially the same electrical circuit 30a to convert thermoelectric device 20 from a cooler to a heater. In FIG. 2c thermoelectric device 20 and electric circuit 20a are configured to produce electricity by placing thermoelectric device 20 between a source of high temperature (not shown) and a source of low temperature (not shown).

Figure 3:
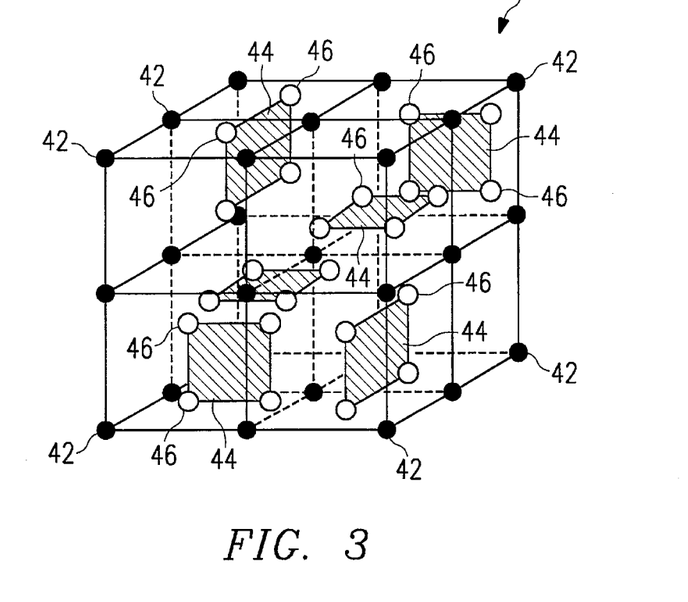
FIG. 3 is an isometric representation of a skutterudite-type crystal lattice structure associated with semiconductor materials which have been fabricated in accordance with the present invention.

Semiconductor materials (sometimes referred to as "semiconductor alloys") $CoSb_3$, $RhSb_3$, $IrSb_3$ and $Co_{1-x-y}Rh_x Ir_y Sb_3$ have been prepared in accordance with the present invention in the form of large, single crystals and polycrystalline ingots with skutterudite crystal lattice structure 40 as shown in FIG. 3. A typical skutterudite crystal lattice structure is defined in part by a unit cell with eight members having the formula $AB_3$. A may be selected from the group consisting of Co, Rh and Ir. B may be Sb. Alloys of these elements having the formula $Co_{1-x-y}Rh_x Ir_y Sb_3$, where $0 \leq x \leq 1$ and $0 \leq y \leq 1$, have also been prepared using the present invention.

Skutterudite-type crystal lattice structure 40 includes a cubic lattice of metal atoms 42. Metal atoms 42 are preferably selected from the group consisting of cobalt, iridium, and/or rhodium. A four-member plenary ring 44 of non-metal atoms 46 is disposed within the cubic lattice structure. Each plenary ring 44 preferably includes four atoms of antimony. Each metal atom 42 has six neighbor atoms 42. Non-metal atoms 46 have two adjacent non-metal atoms 46 and two metal atoms 42. The covalent bonding associated with skutterudite-type crystal lattice structure 40 provides high hole mobility. The complex structure and heavy atoms associated with skutterudite-type crystals also result in low thermal conductivity.

Figure 4:
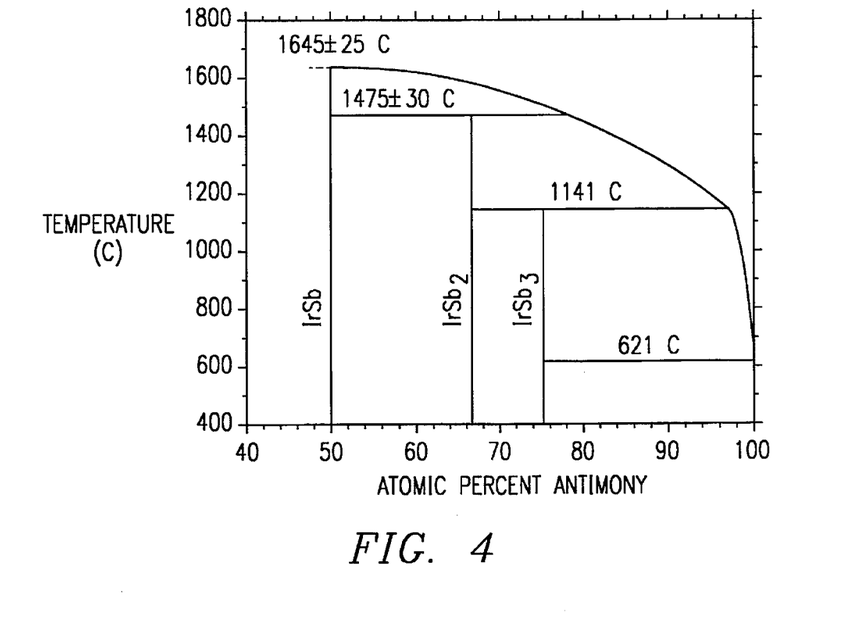
FIG. 4 is an iridium antimony phase diagram.

Semiconductor materials having skutterudite-type crystal lattice structure 40 may be doped with selected impurities to produce N-type thermoelectric elements 22a and P-type thermoelectric elements 22b. By optimizing the doping level, $IrSb_3$ semiconductor alloys may be used to produce P-type thermoelectric elements having a ZT of approximately two at a temperature of 400° C. If desired, thermoelectric device 20 may be manufactured with P-type thermoelectric elements 22b fabricated from $IrSb_3$ and N-type thermoelectric elements 22a fabricated from previously available semiconductor materials such as Bi-Sb alloys, $Bi_2Te_3$ based alloys, PbTe based alloys, $\beta$-$FeSi_2$ based alloys, $Ga_{1-x}In_x Sb$ based alloys, and SiGe alloys Large, single crystals of semiconductor alloys have been prepared in accordance with the present invention using gradient freeze techniques. Liquid-solid phase sintering techniques have been used to prepare large, polycrystalline ingots of semiconductor alloys in accordance with the present invention. The phase diagram for iridium-antimony, as shown in FIG. 4, demonstrates that $IrSb_3$ with the desired skutterudite-type crystal lattice structure is very difficult to obtain. Crystal growth is preferably initiated from a narrow range of compositions. In addition, the liquidus curve in antimony rich region forming IrSb₃ is relatively sharp which further increases the difficulty of separating liquid and solid phases during crystallization.

Depending upon the desired composition of the semiconductor materials either gradient freeze techniques, liquid-solid phase sintering techniques, and low temperature powder sintering with or without hot pressing may be used to produce semiconductor alloys with the desired skutterudite-type crystal lattice structure. For some semiconductor materials such as $CoSb_3$, $RhSb_3$, and $Co_{1-x-y}Rh_xIr_ySb_3$ gradient freeze techniques have produced the desired large, single crystal. Crystal growth by gradient freeze techniques is preferably initiated from non-stoichiometric (antimony rich) melts based on the liquid-solid phase diagram associated with the elements which will comprise the resulting semiconductor materials.

For other semiconductor materials such as single phase $IrSb_3$ and $Co_{1-x-y}Rh_xIr_ySb_3$, liquid-solid phase sintering techniques have produced the desired large, polycrystalline ingots. Semiconductor alloys such as $IrSb_3$ and $Co_{1-x-y}Rh_xIr_ySb_3$ have been produced using low temperature powder sintering and/or hot pressing. Liquid-solid phase sintering, low temperature powder sintering, and hot pressing are preferably conducted in an isothermal furnace starting from an elemental mixture ($TSb_3$) of the desired elements close to stoichiometry (±2 atomic %).

Liquid-solid phase sintering may be satisfactorily performed with powders of Co, Rh, Ir, and shots of Sb. Low temperature powder sintering process is preferably initiated with powders of Co, Ir, and Sb. For some application powders of $IrSb_3$ and $Co_{1-x-y}Rh_xIr_ySb_3$ may also be synthesized into large polycrystalline pellets. Hot pressing may be included as part of the low temperature provider entering process.

Figure 5A:
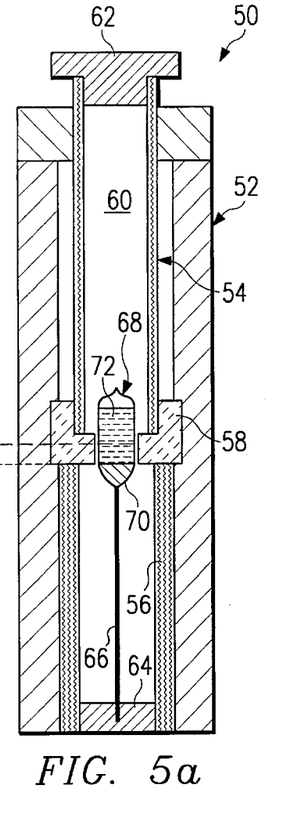
FIG. 5a is a schematic drawing in elevation and in section with portions broken away showing a Bridgman Two-Zone furnace which may be used to prepare semiconductor materials using gradient freeze techniques in accordance with the present invention.

Large, single crystals of semiconductor alloys with the desired skutterudite lattice structure 40 may be grown by using gradient freeze techniques and furnace 50 as shown in FIG. 5a. Furnace 50, frequently referred to as a Bridgman Two-Zone furnace, includes housing 52 with a first or upper heater assembly 54 and a second or lower heater assembly 56. Housing 52 defines in part chamber 60. Thermal baffle 58 is preferably disposed between first heater assembly 54 and second heater assembly 56 intermediate chamber 60. Various components which comprise furnace 50 are preferably disposed vertically within chamber 60 of housing 52.

As shown in FIG. 5a, housing 52 includes end closure 62 which seals the upper portion of chamber 60 and end closure 64 which seals the lower portion of chamber 60. Quartz rod 66 may be vertically disposed within chamber 60. Container 68 is preferably secured to one end of rod 66 adjacent to thermal baffle 58.

The lower portion 70 of container 68 is preferably pointed or tapered with respect to rod 66. Various types of containers 68 may be satisfactorily used with the present invention. A sealed quartz ampoule has been found satisfactory for use with furnace 50. If desired, housing 52 and end closure 64 may be modified to allow a conveyor (not shown) with a plurality of rods 66 and containers 68 to pass sequentially through furnace 50.

Figure 5B:
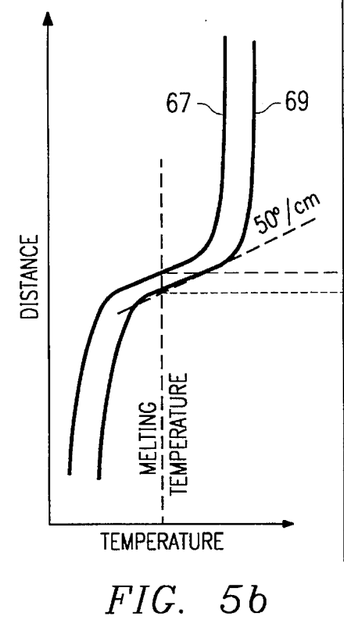
FIG. 5b is a graph showing the temperature gradient associated with growing large, single crystals of semiconductor materials having a skutterudite lattice structure in accordance with the present invention.

Elements such as Co, Rh and Sb powders which will form the desired semiconductor alloy using furnace 50 are preferably sealed within container 68 under a vacuum. Pointed or tapered end 70 of container 68 is attached to quartz rod 66 and disposed vertically within chamber 60. Tapered end 70 and its attachment to rod 66 cooperate to maintain the desired temperature gradients in container 68. Furnace 50 is then heated to establish the desired temperature gradient 69 and controlled cooling 67 as shown in FIG. 5b. Various temperature gradients may be used depending upon the elements placed within container 68 to produce the desired semiconductor alloy.

For one embodiment of the present invention samples of $CoSb_3$ and $RhSb_3$ were directionally crystallized from non-stoichiometric melt 72 rich in antimony. Crystals of $CoSb_3$ and $RhSb_3$ were grown with an axial temperature gradient of about 50° C./cm and a growth rate about 1 mm/day. The crystals of $CoSb_3$ and $RhSb_3$ were approximately 10 mm long and 6 mm in diameter. The average density of the $CoSb_3$ crystals was measured and found to be 99.7% of the theoretical density (7.69 g/cm³). The average density of the $RhSb_3$ crystals was measured and found to be 99.5% of the theoretical density (7.96 g/cm³). Crystals of the $Ir_xCo_{1-x}Sb_3$ solid solutions were also successfully grown by gradient freeze techniques from antimony-rich melts in furnace 50. The samples produced had good semiconducting properties including exceptional P-type Hall mobilities as high as 8000 $cm^2.V^{-1}.s^{-1}$ at room temperature.

Figure 6:
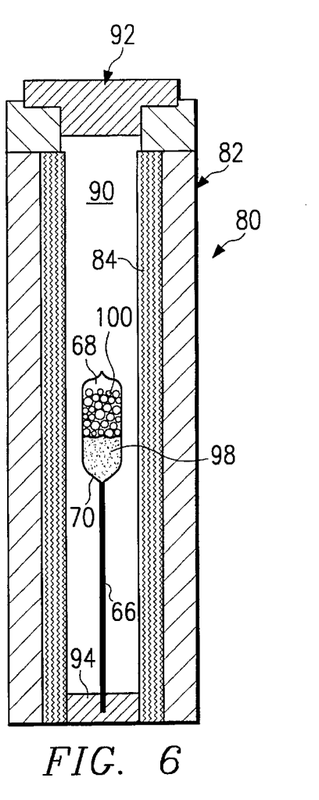
FIG. 6 is a schematic drawing in elevation and in section with portions broken away showing an isothermal furnace which may be used during liquid solid phase sintering to prepare large polycrystalline ingots of semiconductor materials having a skutterudite lattice structure in accordance with the present invention.

Large polycrystalline ingots of semiconductor materials with a skutterudite lattice structure may also be prepared by using liquid-solid phase sintering techniques and furnace 80 as shown in FIG. 6. Furnace 80 may be referred to as an isothermal furnace as compared to furnace 50 which has two different temperature zones. Furnace 80 includes housing 82 with heater assembly 84 disposed therein. Housing 82 defines in part chamber 90. Various components which comprise furnace 80 are preferably vertically disposed within chamber 90 of housing 82.

As shown in FIG. 6, housing 82 includes end closure 92 which seals the upper portion of chamber 90 and end closure 94 which seals the lower portion of chamber 90. Quartz rod 66 is preferably disposed vertically within chamber 90. Container 68 is preferably secured within chamber 90 intermediate end closures 94 and 92 at approximately the mid point of chamber 90. For one embodiment of the present invention vibrating rod 66 improved the yield of the sintering technique.

The elements such as Ir, Rh, Co and Sb which will be used to form the desired semiconductor material may be sealed within container 68. The lower portion 70 of container 68 may be pointed or tapered with respect to quartz rod 66. For some applications container 68 may have a relatively flat lower portion 70. The relationship of lower portion 70 with quartz rod 66 cooperate to maintain the desired temperature in container 68 during preparation of the skutterudite-type crystal structure 40. Various types of containers 68 may be satisfactorily used with the present invention. A sealed quartz crystal or crystal ampoule has been found satisfactory for use with the present invention. As previously noted for furnace 50, housing 82 and end closure 94 may be modified to allow a conveyor (not shown) to pass a plurality of rods 66 and containers 68 sequentially through furnace 80.

Liquid-solid phase sintering techniques have been used to prepare large, polycrystalline ingots of semiconductor material $IrSb_3$ and also some alloys of $(Ir_{1-x-y}Rh_xCO_y)Sb_3$ solid solutions using furnace 80 and container 68. The ingots were approximately 10 mm long and 6 mm in diameter.

The liquid-solid phase sintering technique used to produce $IrSb_3$ and $(Ir_{1-x-y}Rh_xCO_y)Sb_3$ solid solutions included placing a first layer 98 of elemental iridium, cobalt and/or rhodium powders together with a second layer 100 of antimony shots in container 68 sealed under vacuum. In the case of the preparation of a solid solution $(Ir_{1-x-y}Rh_xCo_y)Sb_3$, the powders of iridium, cobalt and rhodium in the desired ratio were loaded in plastic vials, mixed and shaken in a mixer mill (not shown) for about thirty minutes. Container 68 with material layers 98 and 100 was then positioned vertically and heated in furnace 80 as illustrated in FIG. 6. Several different reaction times and temperatures were tried. For some mixtures, the best results were obtained with a reaction time of 24 hours at a temperature of 1000° C. Under these conditions, the resulting ingots were the most dense.

Transport properties measurements performed on samples of $CoSb_3$, $RhSb_3$ and $(Ir_{1-x-y}Rh_xCo_y)Sb_3$ prepared using the previously described procedures and apparatus demonstrated excellent semiconducting and thermoelectric properties. For example, the alloys with skutterudite-type crystal lattice structure 40 had exceptional high P-type Hall mobilities. Room temperature values as high as 7725 $cm^2.V^{-1}.s^{-1}$ were measured on a $RhSb_3$ sample at a doping level of $2.4 \cdot 10^{18}$ $cm^{-3}$. Although linked to the particular crystal structure of this alloy, this high value is also a result of the good quality of the sample. For example, lower mobilities were measured on hot-pressed $RhSb_3$ samples such as a maximum value of 1500 $cm^2.V^{-1}.s^{-1}$. Mobility as high as 1732 $cm^2.V^{-1}.s^{-1}$ were measured on P-type $CoSb_3$ single crystals compared to a maximum value of 290 $cm^2.V^{-1}.s^{-1}$ for samples prepared by other procedures. $IrSb_3$ samples also possessed high P-type Hall mobilities as high as 1241 $cm^2.V^{-1}.s^{-1}$ at a doping level of $7.2 \cdot 10^{18}$ $cm^{-3}$.

Semiconductor alloys and related solid solutions have also been prepared by low temperature powder sintering of iridium, cobalt, rhodium and antimony in ratios close to stoichiometry (±2 atomic %). Completion of the reaction was achieved in times as short as six hours at a temperature of 600° C. The resulting powders of $IrSb_3$ alloy and several compositions of the $(Ir_{1-x-y}Rh_xCo_y)Sb_3$ solid solutions were placed in a graphite die container and subjected to hot pressing of the alloy powders to form the desired polycrystalline pellets. The hot pressing was typically conducted for at least 30 minutes at a temperature of at least 650° C.

These same elemental powders of iridium, cobalt, antimony and rhodium have also been successfully hot-pressed under specific conditions into large pellets (not shown). Several different mixtures of elemental powders were successfully hot-pressed in a graphite die (not shown) into dense polycrystalline pellets about 15 mm long and 6 mm in diameter. The resulting alloys demonstrated exceptional thermoelectric properties. Hot pressing was typically performed for six hours at 800° C.

Doping of elemental and alloyed powders can be achieved by introducing the desired amount of dopant in the initial powder load. By using commercially available hot presses and graphite die containers, this process is quick, cost effective and may be easily adapted to industrial manufacturing of large quantities of $(Ir_{1-x-y}Rh_xCo_y)Sb_3$ samples of different compositions and doping level.

Semiconductor alloys of $CoSb_3$, $RhSb_3$ and $IrSb_3$ with skutterudite-type crystal lattice structure 40 prepared in accordance with the present invention have demonstrated the characteristics shown in the following Table I.

TABLE I

| Material | $CoSb_3$ | $RhSb_4$ | $IrSb_3$ |
|---|---|---|---|
| Melting Point (C.) | 850 | 900 | 1140 |
| Type of formation from the melt | peritectic | peritectic | peritectic |
| Structure type | cubic | cubic | cubic |
| Prototype | $CoAs_3$ | $CoAs_3$ | $CoAs_3$ |
| Number of atoms/unit cell | 32 | 32 | 32 |
| Lattice parameter (Å) | 9.0347 | 9.2322 | 9.2533 |
| Density (g · $cm^{-3}$) | 7.69 | 7.96 | 9.32 |
| Thermal expansion coefficient ($C.^{-1}$) | $13.46 \times 10^{-6}$ | $12.7 \times 10^{-6}$ | $7.96 \times 10^{-6}$ |
| Energy bandgap (eV) | 0.5 | ~0.9 | 1.17 |
| Conductivity type | p | p | p |
| Electrical resistivity (mΩ · cm) at 25 C. | 0.55 | 0.34 | 0.70 |
| Hall mobility (cm2 · $V^{-1}$ · $s^{-1}$) at 25 C. | 1732 | 7725 | 1241 |
| Hall carrier concentration ($cm^{-3}$) at 25 C. | $6.5 \times 10^{18}$ | $2.4 \times 10^{18}$ | $7.2 \times 10^{18}$ |
| Seebeck coefficient (μV · $K.^{-1}$ at 25 C. | 150 | ~80 | 250 |

Figure 7:
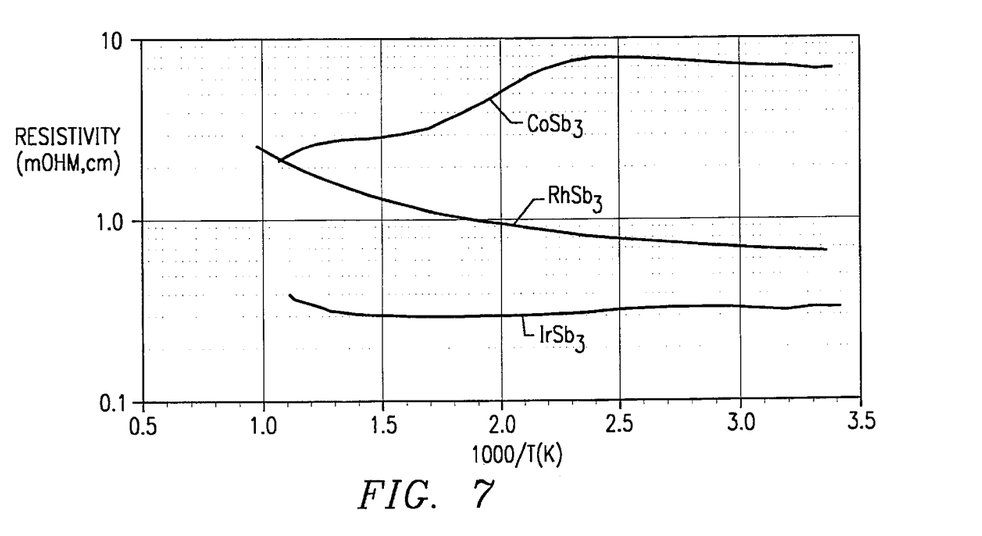
FIG. 7 is a graph showing typical electrical resistivity values as an inverse function of temperature associated with semiconductor materials prepared in accordance with the present invention.
Figure 8:
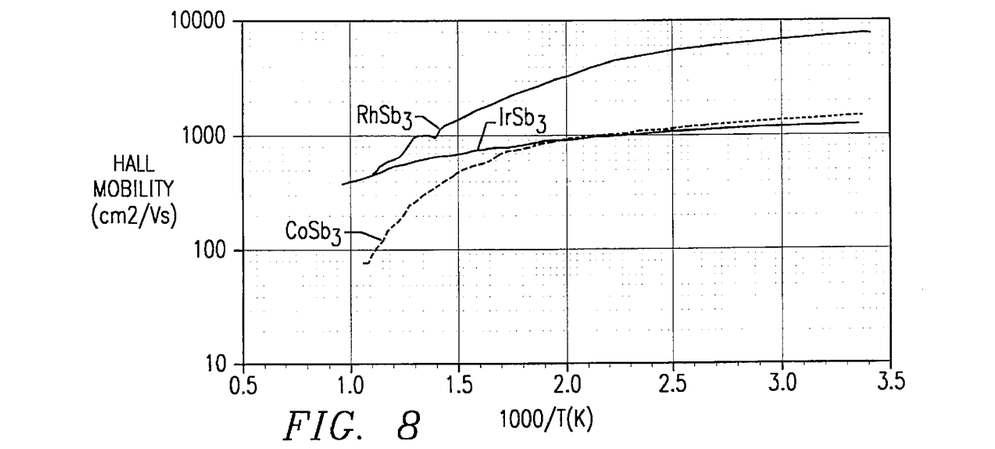
FIG. 8 is a graph showing typical Hall mobility values as an inverse function of temperature associated with semiconductor materials prepared in accordance with the present invention.
Figure 9:
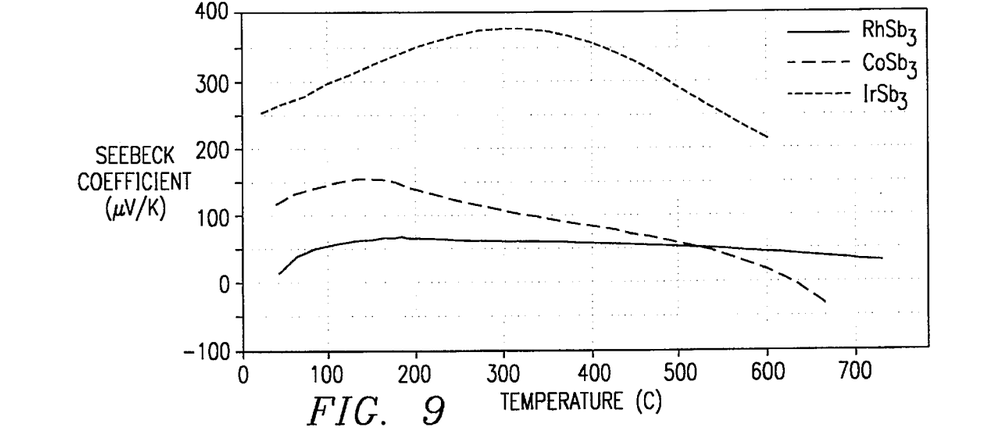
FIG. 9 is a graph showing typical Seebeck coefficients as a function of temperature for semiconductor materials prepared in accordance with the present invention.

FIG. 7 is a graphical representation of typical electrical resistivity values as a function of inverse temperature for semiconductor alloys $CoSb_3$, $RhSb_3$ and $IrSb_3$ having skutterudite-type crystal lattice structure 40. FIG. 8 is a graphical representation of typical Hall mobility values as a function of inverse temperatures for semiconductor alloys $CoSb_3$, $RhSb_3$ and $IrSb_3$ having skutterudite-type crystal lattice structure 40. FIG. 9 is a graphic representation of typical Seebeck coefficient values as a function of temperature for semiconductor alloys $CoSb_3$ and $IrSb_3$ having skutterudite-type crystal lattice structure 40.

Figure 10:
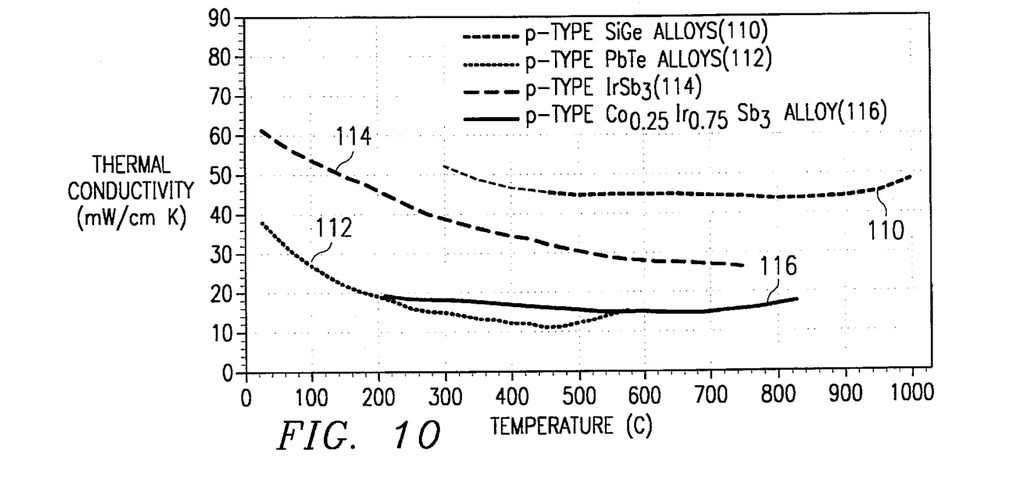
FIG. 10 is a graph showing thermal conductivity as a function of temperature for semiconductor materials prepared in accordance with the present invention as compared with presently available thermoelectric materials.

FIG. 10 shows comparisons of thermal conductivity as a function of temperature for semiconductor materials $IrSb_3$ and $Ir_{0.75}Co_{0.25}Sb_3$ prepared in accordance with the present invention as compared with previously available thermoelectric materials SiGe alloys and PbTe alloys. Curves 110 and 112 show thermal conductivity measured for SiGe alloys and PbTe based alloys respectively. Curves 114 and 116 are based on thermal conductivity measurements for semiconductor materials $IrSb_3$ and $Ir_{0.75}Co_{0.25}Sb_3$ respectively prepared in accordance with the present invention.

Figure 11:
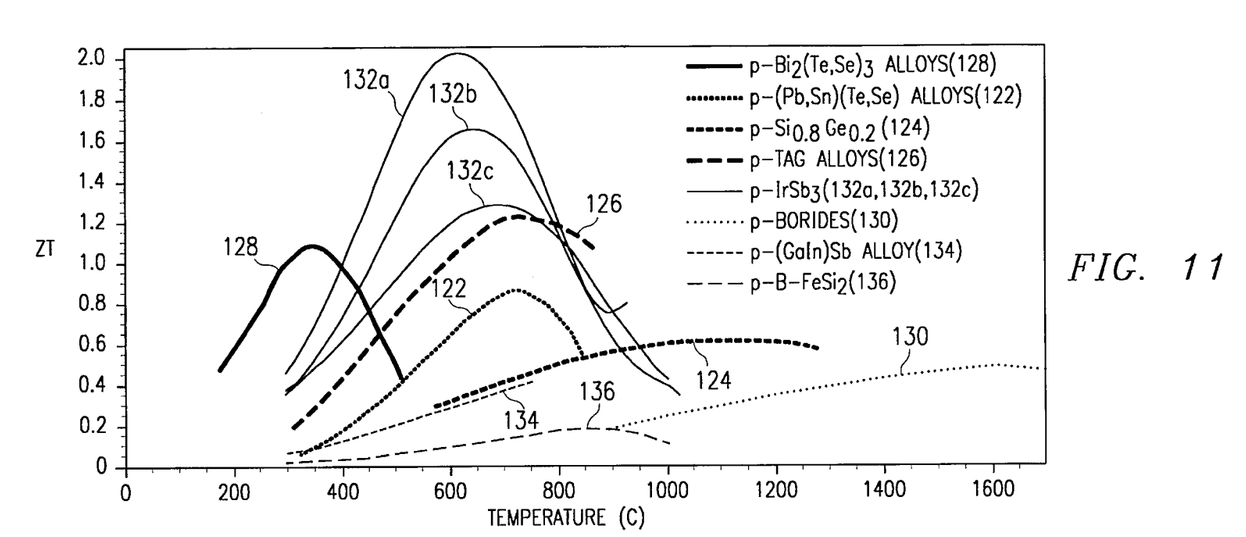
FIG. 11 is a graph showing the ZT as a function of temperature for P-type semiconductor materials prepared in accordance with the present invention as compared with the ZT of previously available P-type semiconductor materials.

FIG. 11 is a graph showing various values of ZT as a function of temperature for three samples (132a, 132b and 132c) of semiconductor material $IrSb_3$ with different P-type doping levels. FIG. 11 also contains a graphical representation of ZT for previously available P-type thermoelectric materials. Ni, Pd, Pt, Te, Se. Cu, Ag and Au have been found to be satisfactory doping impurities for use with semiconductor alloys prepared in accordance with the present invention. Excess amounts of Sb and/or Ir have also been found to result in substantial changes in carrier concentration for use with the present invention.

Multiple stage thermoelectric coolers (not shown) are typically fabricated by vertically stacking two or more single stage thermoelectric devices. Each ascending thermoelectric device will have fewer thermoelectric elements or thermocouples. A multiple stage thermoelectric cooler is therefore typically pyramid shaped because the lower stage requires more thermoelectric elements to transfer the heat dissipated from the upper stage in addition to the heat pumped from the object being cooled by the multiple stage thermoelectric cooler. Field effect transistors operating at high temperature are desirable and may be cooled from 300° C. to 125° C. by using such multiple stage thermoelectric coolers having thermoelectric elements fabricated in accordance with the present invention.

Figure 12:
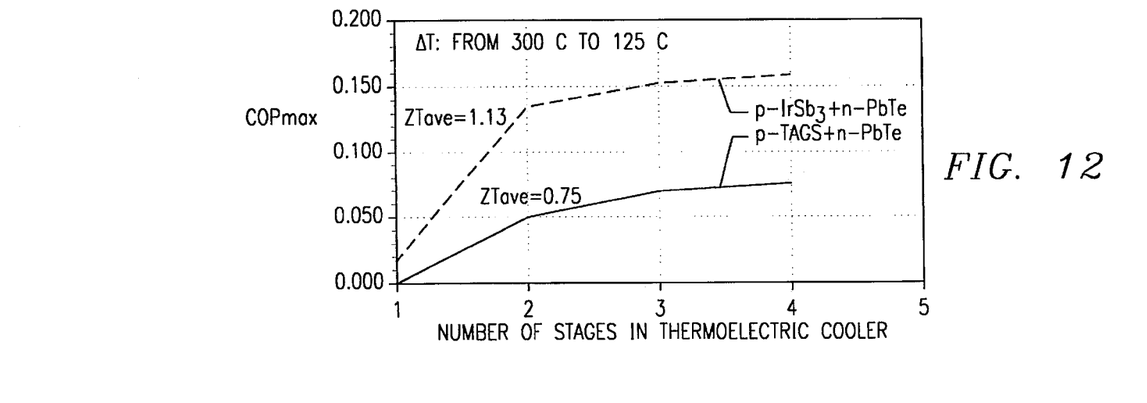
FIG. 12 is a graph showing the calculated performance of a multiple stage thermoelectric cooler fabricated in part from semiconductor materials incorporating the present invention as compared to a multiple stage thermoelectric cooler fabricated from previously available semiconductor materials.

P-type semiconductor material $IrSb_3$ prepared in accordance with the present invention may be used to provide a portion of the thermoelectric elements in a multiple stage thermoelectric cooler. Currently available N-type semiconductor materials such as $Bi_2Te_3$ or any other suitable N-type semiconductor material may be used to provide another portion of the thermoelectric elements. The resulting combination substantially enhances the performance of the thermoelectric device. This combination of P-type and N-type semiconductor materials is particularly useful in the 100° C. to 400° C. temperature range. FIG. 12 is a graphical representation showing the increase in multiple stage thermoelectric cooler performance resulting from the use of P-type semiconductor materials $IrSb_3$. FIG. 12 shows the coefficient of performance ($COP_{MAX}$) as a function of the number of stages in each thermoelectric cooler.

Figure 13:
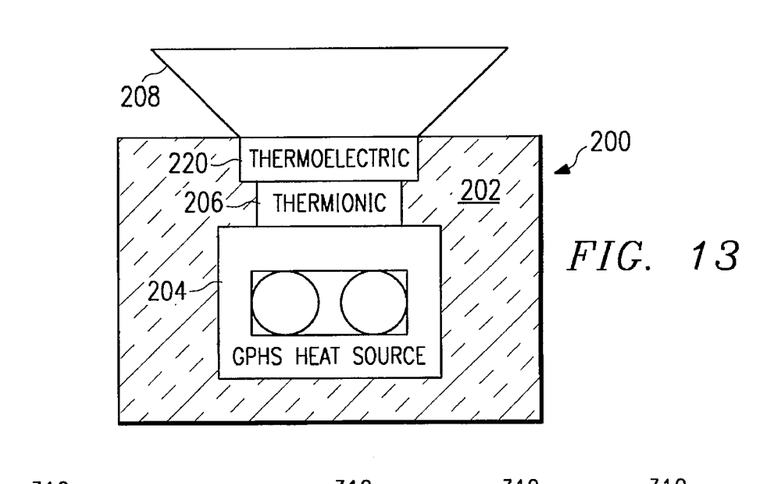
FIG. 13 is a schematic representation of a hybrid thermionic-thermoelectric power generator which may be manufactured with thermoelectric materials incorporating the present invention.

A two stage hybrid thermionic-thermoelectric generator 200 is shown in FIG. 13. Generator 200 preferably includes protective housing 202 with a general purpose heat source 204 disposed therein. Thermionic device 206 is disposed adjacent to heat source 204. Thermoelectric device 220 may be placed adjacent to thermionic device 206. Thermoelectric device 220 will preferably include one or more thermoelectric elements (not shown) which have been fabricated from thermoelectric alloys in accordance with the present invention. One or more fin type radiators 208 are disposed on the exterior of housing 202. Radiator 208 cooperates with heat source 204 to establish a temperature gradient across thermionic device 206 and thermoelectric device 220. By using thermoelectric elements fabricated in accordance with the present invention, the energy conversion efficiency of thermoelectric device 220 is substantially enhanced. Also, single stage thermoelectric devices can be manufactured from thermoelectric elements fabricated in accordance with the present invention to improve the overall design feasibility of hybrid thermionic/thermoelectric generators.

Figure 14:
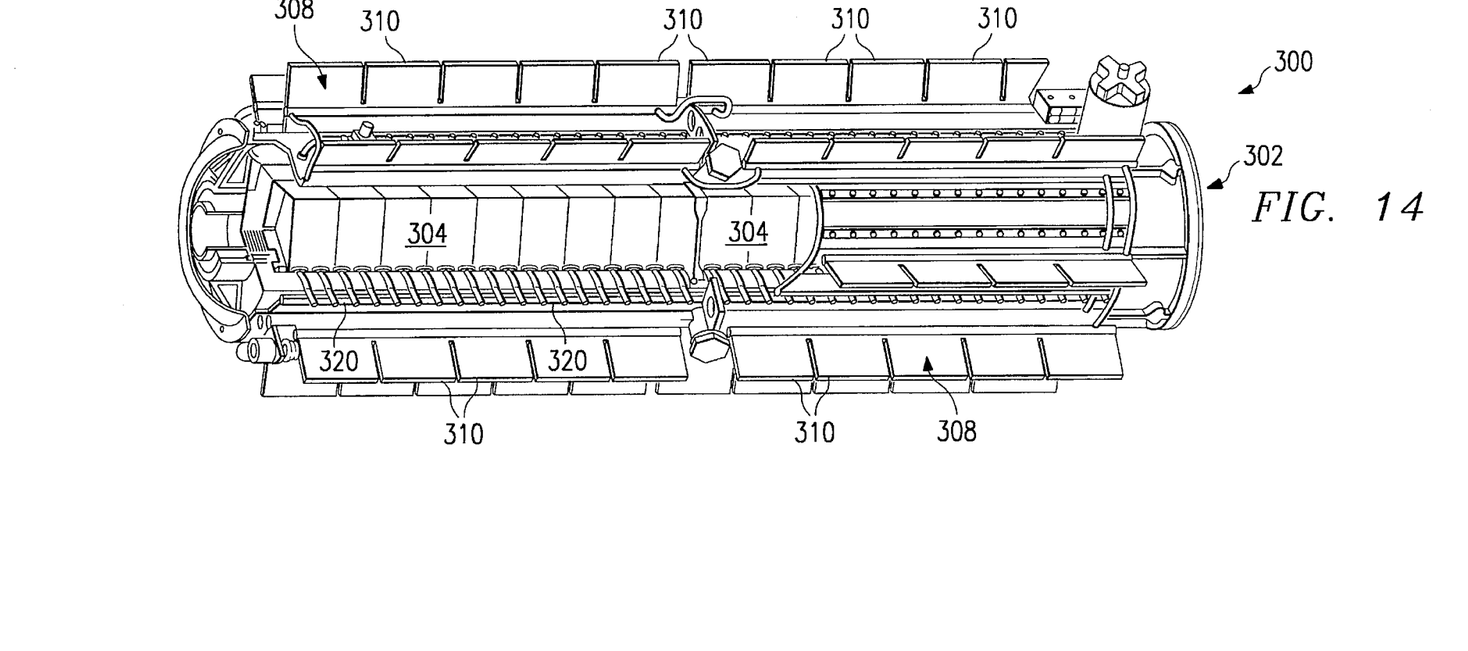
FIG. 14 is a schematic representation of an actual radioisotope thermoelectric power generator which may be manufactured with thermoelectric materials incorporating the present invention.

Radioisotope thermoelectric generator 300 is shown in FIG. 14. Radioisotope thermoelectric generator 300 is used to convert nuclear energy to electrical energy. The principle components of radioisotope thermoelectric generator 300 include supporting structure 302, a plurality of general purpose heat sources (radioactive material) 304, a plurality of thermoelectric devices 320 and cooling assembly 308. Thermoelectric devices 320 are preferably manufactured from thermoelectric alloys which have been fabricated in accordance with the present invention. Cooling assembly 308 cooperates with heat sources 304 to establish the desired temperature gradient across thermoelectric device 320 and to produce electrical power as a result of the temperature difference between heat source 304 and cooling assembly 308. A plurality of fins 310 are used to dissipate heat energy to the surrounding environment. Generators 200 and 300 are particularly beneficial for use in space exploration activities.

Although the present invention has been described in detail, it should be understood that various changes, substitutions and alterations can be made herein without departing from the spirit and the scope of the invention as defined in the following claims.

What is claimed is:

1. A thermoelectric device having a plurality of thermoelectric elements with at least one of the thermoelectric elements comprising a first material having a skutterudite-type crystal lattice structure with a unit cell of eight groups of $AB_3$ wherein A comprises a metal atom and B comprises a non-metal atom.

2. The thermoelectric device as defined in claim 1 wherein the first material further comprises $IrSb_3$.

3. The thermoelectric device as defined in claim 1 wherein the first material further comprises $CoSb_3$.

4. The thermoelectric device as defined in claim 1 wherein the first material further comprises $RhSb_3$.

5. The thermoelectric device as defined in claim 1 wherein the first material further comprises a semiconductor alloy having the formula:

$$Co_{1-x-y}Rh_xIr_ySb_3$$

wherein $0 \leq x \leq 1$ and $0 \leq y \leq 1$.

6. A thermoelectric device comprising:

a first material having a skutterudite-type crystal lattice structure with a unit cell of eight groups of $AB_3$ wherein A comprises a metal atom and B comprises a non-metal atom; and a second material selected from the group consisting of Bi-Sb alloys, $Bi_2Te_3$ based alloys, PbTe based alloys, $\beta$-$FeSi_2$ based alloys, $Ga_{1-x}In_xSb$ based alloys, and SiGe alloys.

7. A thermoelectric device having a plurality of thermoelectric elements with at least one of the thermoelectric elements comprising a first material having the formula:

$$Co_{1-x-y}Rh_xIr_ySb_3$$

wherein $0 \leq x \leq 1$ and $0 \leq y \leq 1$.

8. The thermoelectric device as defined in claim 7 wherein the first material further comprises a skutterudite-type crystal lattice structure.

9. A thermoelectric device comprising:

a first material having the formula:

$$Co_{1-x-y}Rh_xIr_ySb_3$$

wherein $0 \leq x \leq 1$ and $0 \leq y \leq 1$; and a second material selected from the group consisting of Bi-Sb alloys, $Bi_2Te_3$ based alloys, PbTe based alloys, $\beta$-$FeSi_2$ based alloys, $Ga_{1-x}In_xSb$ based alloys, and SiGe alloys.

10. A thermoelectric device having a plurality of thermoelectric elements formed from at least two different types of semiconductor materials comprising:

a portion of the thermoelectric elements formed from P-type semiconductor material having a skutterudite-type crystal lattice structure; and the P-type semiconductor material having the formula:

$$Co_{1-x-y}Rh_xIr_ySb_3$$

wherein $0 \leq x \leq 1$ and $0 \leq y \leq 1$.

11. The thermoelectric device as defined in claim 10 further comprising another portion of the thermoelectric elements formed from N-type semiconductor material selected from the group consisting of Bi-Sb alloys, $Bi_2Te_3$ based alloys, PbTe based alloys, β-$FeSi_2$ based alloys, $Ga_{1-x}In_xSb$ based alloys, and SiGe alloys.

12. Apparatus using gradient freeze techniques to prepare a semiconductor alloy for use in fabricating thermoelectric elements comprising:

a furnace defined in part by a housing having a chamber with a first heater and a second heater disposed therein;

the first heater disposed within the chamber above the second heater;

a thermal baffle disposed within the chamber between the first heater and the second heater;

a container disposed within the chamber with the container adjacent to the thermal baffle;

a plurality of elemental materials disposed within the container for melting within the furnace to form the desired semiconductor alloys;

a sealed vessel with a first elemental material and a second elemental material; and the first elemental material selected from the group consisting of iridium, rhodium and cobalt, and the second elemental material comprising antimony.

13. The apparatus as defined in claim 12, further comprising an antimony rich melt with a composition between 90% and 99.5% antimony as compared to the first elemental material.

14. The apparatus as defined in claim 12 further comprising the first heater, the second heater, and the thermal baffle cooperating to form a sharp temperature gradient within the container for forming a single crystal of semiconductor alloy selected from the group consisting of $CoSb_3$, $RhSb_3$ and $Co_{1-x-y}Rh_xIr_ySb_3$ wherein $0 \leq x \leq 1$ and $0 \leq y \leq 1$.

15. Apparatus using liquid-solid phase sintering techniques to prepare a semiconductor alloy for use in fabricating thermoelectric elements comprising:

an isothermal furnace defined in part by a housing having a chamber with a heater disposed therein;

a container disposed within the chamber, with the container spaced intermediate from the interior surfaces of the chamber; and a stoichiometric mixture of elemental materials selected from the group consisting of Co, Rh, Ir and Sb disposed within the container for forming polycrystalline ingots.

16. The apparatus as defined in claim 15 further comprising:

the container sealed with a vacuum formed therein;

a rod vertically disposed within the chamber and the container secured to one end of the rod; and the lower portion of the container tapered towards the one end of the rod.

17. The apparatus as defined in claim 15 further comprising:

a layer of iridium powder disposed within the lower portion of the container adjacent to the rod; and a layer of antimony disposed within the container above the iridium powder.

18. The apparatus as defined in claim 15 wherein the container further comprises:

a sealed vessel with a first elemental material layer and a second elemental material layer;

the first elemental material layer disposed within the lower portion of the sealed vessel, and the second elemental material layer disposed above the first material layer; and the first elemental material layer selected from the group consisting of iridium, rhodium and cobalt, and the second elemental material layer comprising antimony.

19. The apparatus as defined in claim 15 wherein the stoichiometric mixture further comprises one layer of material having the formula:

$$Co_{1-x-y}Rh_xIr_y$$

wherein $0 \leq x \leq 1$ and $0 \leq y \leq 1$.

20. A method of preparing a semiconductor alloy having a skutterudite-type crystal lattice structure for use in fabricating thermoelectric elements comprising the steps of:

placing a first material selected from the group consisting of Ir, Rh and Co, and a second material comprising antimony in a container;

placing the container within a furnace with the second material vertically disposed above the first material;

heating the furnace to a preselected temperature to allow liquid-solid phase sintering of the first material and the second material; and retaining the container within the furnace for a preselected length of time to allow formation of polycrystalline ingots of the semiconductor alloy having the desired skutterudite-type crystal lattice structure.

21. The method of preparing a semiconductor alloy as defined in claim 20, further comprising the steps of forming an elemental mixture having the general formula ($TSb_3$) wherein T is provided by the first material and the elemental mixture is within ±2 atomic % of stoichiometry.

22. The method of preparing a semiconductor alloy as defined in claim 20, further comprising the steps of:

forming a vacuum in the container after the first and second layers of material have been placed therein; and sealing the container to trap the vacuum with the first and second material disposed therein.

23. The method of preparing a semiconductor alloy as defined in claim 22 further comprising the step of forming the first material from a mixture of Ir, Co and Rh with the formula:

$$Co_{1-x-y}Rh_xIr_y$$

wherein $0 \leq x \leq 1$ and $0 \leq y \leq 1$.

24. The method of preparing a semiconductor alloy as defined in claim 20 further comprising the steps of:

heating the furnace to a temperature of at least 650° C.; and retaining the container in the furnace for at least fifteen minutes.

25. The method of preparing a semiconductor alloy as defined in claim 20 further comprising the step of vibrating a rod attached to the container for stirring the materials disposed within the container during growth of the skutterudite-type crystal lattice structure.

26. A method of preparing a semiconductor alloy having a skutterudite-type crystal lattice structure for use in fabricating thermoelectric elements comprising the steps of:

placing a first material selected from the group consisting of Ir, Rh and Co, and a second material comprising antimony in a container;

placing the container with the first material and second material vertically disposed within a furnace having two heaters;

heating the furnace to establish a preselected temperature gradient to melt the first and second materials to form a liquid and to grow a semiconductor crystal from the liquid by gradient freeze techniques; and retaining the container within the furnace for a preselected length of time to allow growing the crystal of the semiconductor alloy having the desired skutterudite-type crystal lattice structure.

27. The method of preparing a semiconductor alloy as defined in claim 26, further comprising the steps of forming the first material from cobalt powder and the second material from antimony powder with an atomic ratio rich in antimony.

28. The method of preparing a semiconductor alloy as defined in claim 27, further comprising the steps of:

forming a vacuum in the container after the first and second materials have been placed therein; and sealing the container to trap the vacuum with the first and second material disposed therein.

29. The method of preparing a semiconductor alloy as defined in claim 26 further comprising the step of forming the first material from a mixture of Ir, Co and Rh with the formula:

$$Co_{1-x-y}Rh_xIr_y$$

wherein $0 \leq x \leq 1$ and $0 \leq y \leq 1$.

30. The method of preparing a semiconductor alloy as defined in claim 26 further comprising the step of attaching one end of the container with a rod vertically disposed in the furnace.

31. A method of preparing a semiconductor alloy for use in fabricating thermoelectric elements from an approximately stoichiometric mixture comprising the steps of:

placing elemental powders selected from the group consisting of Ir, Rh, Co and Sb in a container to form the mixture;

placing the container with the mixture within an isothermal furnace; and retaining the container and the mixture within the isothermal furnace for a preselected length of time to allow formation of the semiconductor alloyed powders having a skutterudite-type crystal lattice structure.

32. The method of preparing a semiconductor alloy as defined in claim 31, further comprising the steps of placing the alloyed powders in a graphite die container.

33. The method of preparing a semiconductor alloy as defined in claim 31, further comprising the step of retaining the container in the isothermal furnace for at least 30 minutes at a temperature not higher than 630° C. to form the alloyed powders.

34. The method of preparing a semiconductor alloy as defined in claim 33 further comprising to steps of:

placing the alloyed powders in an isothermal furnace having a press;

applying pressure to the powders with the press for at least 30 minutes to form polycrystalline pellets; and maintaining the isothermal furnace at a temperature of at least 650° C.

35. The method of preparing a semiconductor alloy as defined in claim 31, further comprising the step of forming the mixture with the formula IrSb$_3$.

36. The method of preparing a semiconductor alloy as defined in claim 31 further comprising the step of forming the mixture with the formula:

$$Co_{1-x-y}Rh_xIr_ySb_3$$

wherein $0 \leq x \leq 1$ and $0 \leq y \leq 1$.

37. A method of preparing a semiconductor alloy for use in fabricating thermoelectric elements from an approximately stoichiometric mixture comprising the steps of:

placing elemental powders selected from the group consisting of Ir, Rh, Co, and Sb in a container to form the mixture;

placing the container with the mixture into an isothermal furnace having a press; and applying pressure to the mixture with the press for at least 30 minutes while maintaining the temperature of the isothermal furnace at a temperature of at least 600° C. to form polycrystalline pellets having a skutterudite-type crystal lattice structure from the mixture.

38. The method of preparing a semiconductor alloy as defined in claim 37 further comprising the steps of placing the mixture in a graphite die container.

39. The method of preparing a semiconductor alloy as defined in claim 37, further comprising the step of forming the mixture with the formula IrSb$_3$.

40. The method of preparing a semiconductor alloy as defined in claim 39 further comprising the step of forming the mixture with the formula:

$$Co_{1-x-y}Rh_xIr_ySb_3$$

wherein $0 \leq x \leq 1$ and $0 \leq y \leq 1$.

41. A radioisotope thermoelectric generator having a general purpose heat source and a cooling assembly with a thermoelectric device disposed therebetween comprising:

a plurality of thermoelectric elements formed from at least two different types of semiconductor materials comprising:

a portion of the thermoelectric elements formed from a P-type semiconductor material having a skutterudite-type crystal lattice structure; and the P-type semiconductor material having the formula:

$$Co_{1-x-y}Rh_xIr_ySb_3$$

wherein $0 \leq x \leq 1$ and $0 \leq y \leq 1$.

42. The radioisotope thermoelectric generator as defined in claim 41 further comprising another portion of the thermoelectric elements formed from an N-type semiconductor material selected from the group consisting of alloys of Bi-Sb alloys, Bi$_2$Te$_3$ based alloys, PbTe based alloys, β-FeSi$_2$ based alloys, Ga$_{1-x}$In$_x$Sb based alloys, and SiGe alloys.

* * * * *